United States Patent
Lee et al.

(10) Patent No.: US 8,674,459 B2
(45) Date of Patent: Mar. 18, 2014

(54) THREE-DIMENSIONAL MEMORY DEVICES AND METHODS OF MANUFACTURING AND OPERATING THE SAME

(75) Inventors: Ming-Hsiu Lee, Hsinchu (TW); Yen-Hao Shih, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 358 days.

(21) Appl. No.: 13/022,588

(22) Filed: Feb. 7, 2011

(65) Prior Publication Data

US 2011/0121411 A1  May 26, 2011

Related U.S. Application Data

(60) Continuation of application No. 12/471,411, filed on May 25, 2009, now Pat. No. 7,911,856, which is a division of application No. 11/385,360, filed on Mar. 21, 2006, now Pat. No. 7,554,873.

(60) Provisional application No. 60/663,866, filed on Mar. 21, 2005.

(51) Int. Cl.
*H01L 29/78* (2006.01)

(52) U.S. Cl.
USPC ............... 257/413; 257/288; 257/E29.255

(58) Field of Classification Search
USPC .............. 365/189.14; 257/288, 413, E29.255
See application file for complete search history.

(56) References Cited

U.S. PATENT DOCUMENTS

| | | | |
|---|---|---|---|
| 6,034,882 A | 3/2000 | Johnson et al. | |
| 6,630,710 B1 * | 10/2003 | Augusto | 257/327 |
| 6,885,066 B2 * | 4/2005 | Miura | 257/347 |
| 6,927,414 B2 * | 8/2005 | Ouyang et al. | 257/20 |
| 7,119,417 B2 * | 10/2006 | Sorada et al. | 257/616 |
| 2003/0030074 A1 | 2/2003 | Walker et al. | |

FOREIGN PATENT DOCUMENTS

WO    2004090984    10/2004

* cited by examiner

*Primary Examiner* — Allison P Bernstein
(74) *Attorney, Agent, or Firm* — Jianq Chyun IP Office

(57) ABSTRACT

The invention describes a semiconductor cell including a gate, a dielectric layer, a channel layer, a source region, a drain region and an oxide region. The dielectric layer is adjacent to the gate. The channel layer is adjacent to the dielectric layer and is formed above a source region, a drain region, and an oxide region.

10 Claims, 16 Drawing Sheets

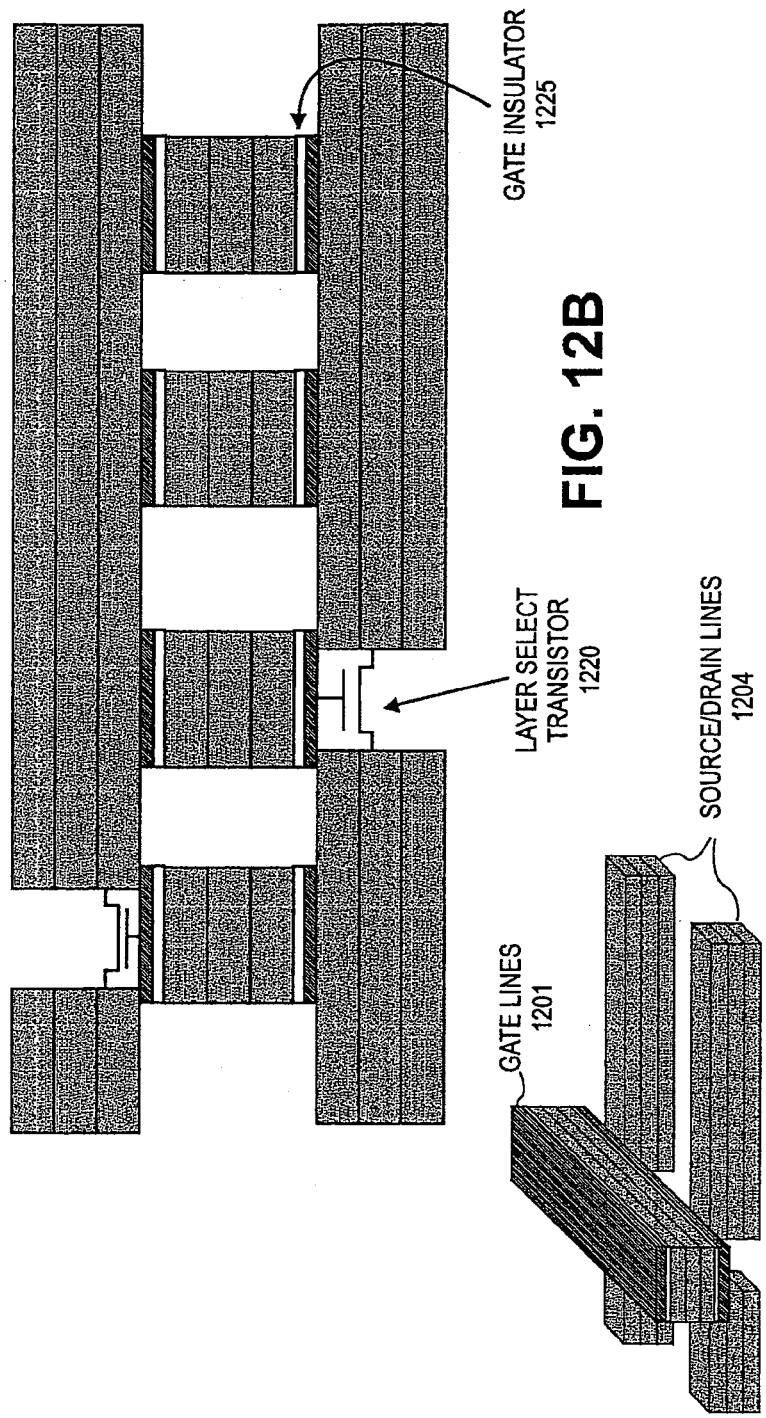

THREE-DIMENSIONAL MEMORY DEVICES AND METHODS OF MANUFACTURING AND OPERATING THE SAME

CROSS-REFERENCE TO RELATED APPLICATION

This application is a continuation application of and claims the priority benefit of an application Ser. No. 12/471,411, field on May 25, 2009, which is a divisional application of and claims the priority benefit of an application Ser. No. 11/385,360, filed on Mar. 21, 2006. The prior application Ser. No. 11/385,360 claims the priority benefit of U.S. Provisional application Ser. No. 60/663,866, filed on Mar. 21, 2005. The entirety of each of the above-mentioned patent applications is hereby incorporated by reference herein and made a part of this specification.

BACKGROUND OF THE INVENTION

1. Field of Invention

The invention relates generally to memory devices and, more particularly, to three-dimensional memory devices and methods of manufacturing and operating the same. Specifically, the invention relates to decoding techniques for addressing memory cells in three-dimensional memory devices, the present invention relates to a technology to detection of a face on an image.

2. Description of Related Art

Advancements in electronic devices have increased the need for larger memory capacity. To increase memory capacity, memory devices have become smaller and more compact. Typically, memory devices include memory cells arranged in a two-dimensional array. Because of space limitations, increasing memory capacity requires innovated circuit designs for two-dimensional memory devices. One alternative design to increase memory capacity is forming memory cells in multiple layers or planes—i.e., a three-dimensional (3D) memory device.

Designing and debugging 3D memory devices, however, can be problematic. For instance, because memory cells are placed in multiple layers or planes, the electrical interconnections between the memory cells and to the substrate require intricate design. In particular, connecting electrical lines in every layer to the ground layer or substrate layer can be difficult to implement. In addition, addressing or handling memory cells across multiple layers complicates the design process. Thus, what is needed is a three-dimensional memory device allowing for simple handling and connection of memory cells across multiple layers or planes.

SUMMARY OF THE INVENTION

The invention provides a semiconductor cell comprising a gate, a dielectric layer, a channel layer, a source region, a drain region and an oxide region. The dielectric layer is adjacent to the gate. The channel layer is adjacent to the dielectric layer and is formed above a source region, a drain region, and an oxide region.

According to one embodiment of the present invention, the oxide region is a silicon dioxide region.

According to one embodiment of the present invention, the oxide region is located between the source region and the drain region.

According to one embodiment of the present invention, the channel layer is located between the dielectric layer and the oxide region.

According to one embodiment of the present invention, the dielectric layer is located between the gate and the channel layer.

According to one embodiment of the present invention, the channel layer bridges the source region and the drain region.

According to one embodiment of the present invention, the channel layer includes a p-type silicon Si layer.

According to one embodiment of the present invention, each of the gate, the source region and the drain region includes a stacked structure.

According to one embodiment of the present invention, the stacked structure is a sandwiched structure including a first polysilicon layer, a second polysilicon layer and a metal silicide layer between the first polysilicon layer and the second polysilicon layer.

According to one embodiment of the present invention, the metal silicide layer includes a sandwiched silicide structure of polysilicon/TiN/TiSi2 or WSi/TiN/polysilicon.

According to one embodiment of the present invention, the gate, the source region and the drain region respectively include doped polysilicon, metal silicide, tungsten, cobalt, titanium or nickel.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the Drawings

FIG. 12A illustrates another example of a three-dimensional schematic diagram of neighboring layer select transistors having source/drain lines and gate lines.

FIG. 12B illustrates one example of a cross-sectional view of the memory device of FIG. 12A.

DESCRIPTION OF THE PREFERRED EMBODIMENTS

Examples consistent with the invention three-dimensional (3D) memory devices and techniques for addressing and handling memory cells in multiple planes or layers. The memory device may use thin-film-transistor (TFT) memory cells. The cells may be organized in planes each having a memory array, and the planes may be stacked vertically for providing multiple layers of memory arrays to form a three-dimensional (3D) memory matrix or device. Examples of memory devices described herein are disclosed in the related application, entitled "THREE-DIMENSIONAL MEMORY DEVICES," noted above.

To operate such memory devices, layer decoding techniques are disclosed that can transform the operation of a complex three-dimensional memory device to an operation scheme similar to that of a two-dimensional memory array. In some examples, the operation of a two-dimensional memory can be implemented in a three-dimensional memory device after a layer or plane (e.g., a horizontal plane) has been selected. The layer decoding techniques disclosed herein can improve the design and debugging process for three-dimensional memory devices.

To select a layer, in some examples, thin film transistors (TFTs) can be used as layer-selecting transistors. These TFTs may be formed together with each layer or plane of the memory arrays without forming them separately on the substrate, thereby saving space on the substrate and not requiring complicated circuitry on the periphery for memory addressing. By using such layer-selecting TFTs, an organized addressing scheme can be implemented with three-dimensional parameters, e.g., X and Y parameters can be used for addressing rows and columns of memory cells and a Z parameter can be used for addressing a particular layer or plane in the 3D memory device. The layer decoding scheme described herein allows for the number of layers or planes to be easily changed with minimal redesign of memory devices.

Figure 1:
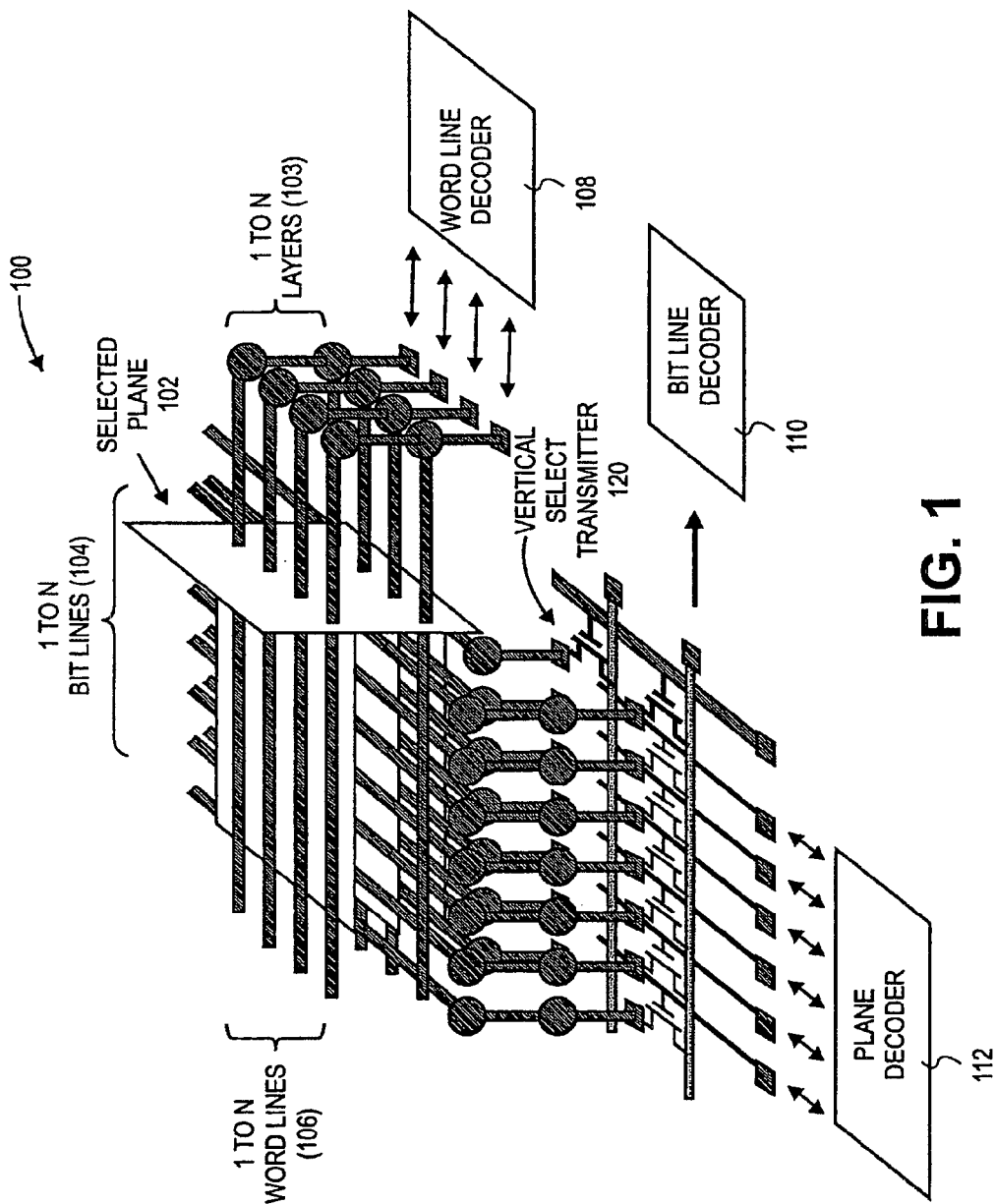
FIG. 1 illustrates an exemplary three-dimensional memory device that decodes and addresses memory cells in selected vertical planes.

FIG. 1 illustrates an exemplary three-dimensional memory device 100 that decodes and addresses memory cells using selected vertical planes 102. Memory device 100 includes 1 to N layers (103) having corresponding 1 to N word lines (106) and bit lines (104). Memory cells (not shown) are formed at the intersection of the word lines 106 and bit lines 104 on each layer 103. The word lines 106 of each layer 103 is connected to a word line decoder 108 and the bit lines 104 of each layer 103 is connected to a bit line decoder 110. Each layer 103 is connected to layer decoder 112. In this example, the memory cells may be decoded by defining a separate vertical plane 102 in which vertical plane decoder 112 selects the selected plane 102 via a vertical select transistor 120.

Figure 2:
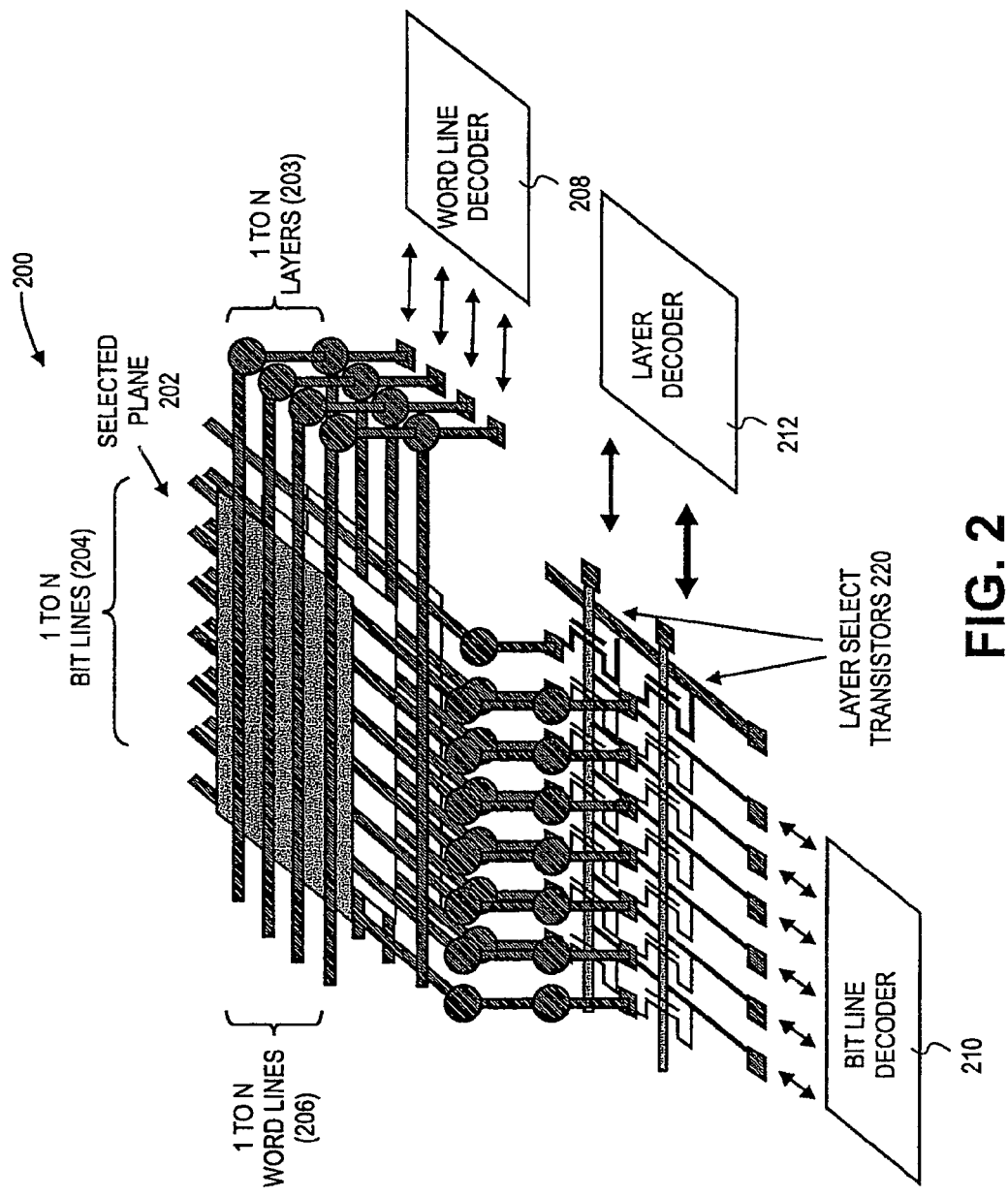
FIG. 2 illustrates an exemplary three-dimensional memory device that decodes and addresses memory cells in selected horizontal planes.

FIG. 2 illustrates an exemplary three-dimensional memory device 200 that decodes or addresses memory cells using a selected horizontal layer or plane 202. Memory device 200 includes 1 to N layers (203) having corresponding 1 to N word lines (206) and bit lines (204). Memory cells (not shown) are formed at the intersection of the word lines 206 and bit lines 204 on each layer 203. The word lines 206 of each layer 203 is connected to a word line decoder 208 and the bit lines 104 of each layer 203 is connected to a bit line decoder 210. Each layer 203 is connected to layer decoder 212. In this example, the memory cells may be decoded by defining separate horizontal layers or planes 202 in which a layer decoder 212 selects the selected horizontal plane 202 via appropriate layer select transistors 220. In one example, a single transistor can be used to select a horizontal plane 202 for decoding or addressing of memory cells. In this example, layer select transistors 220 can be formed on the ground layer of a substrate using conventional techniques. In other examples, corresponding layer select transistors 220 can be formed on individual planes 202 to avoid using space on the substrate.

Referring to selected horizontal plane 202, addressing or accessing memory cells the on the selected plane will now be described. Layer decoder 212 can receive 3D parameters such as a Z parameter for selecting the plane 202 and outputs a signal to activate respective layer select transistors 220 (e.g., the lower select transistor one in FIG. 2) that selects selected plane 202. In other examples, multiple transistors can be activated to select a plane. The word line decoder 208 and/or bit line decoder 210 can receive other 3D parameters such as X and Y parameters to access rows and columns of memory arrays in the selected plane 202. For example, word line decoder 208 can output a signal to activate one or more memory cells and data stored in the memory cells can be read on the bit lines by bit line decoder 210. Thus, memory cells may be decoded or addressed based on the horizontal plane the memory cells are located on.

Figure 3:
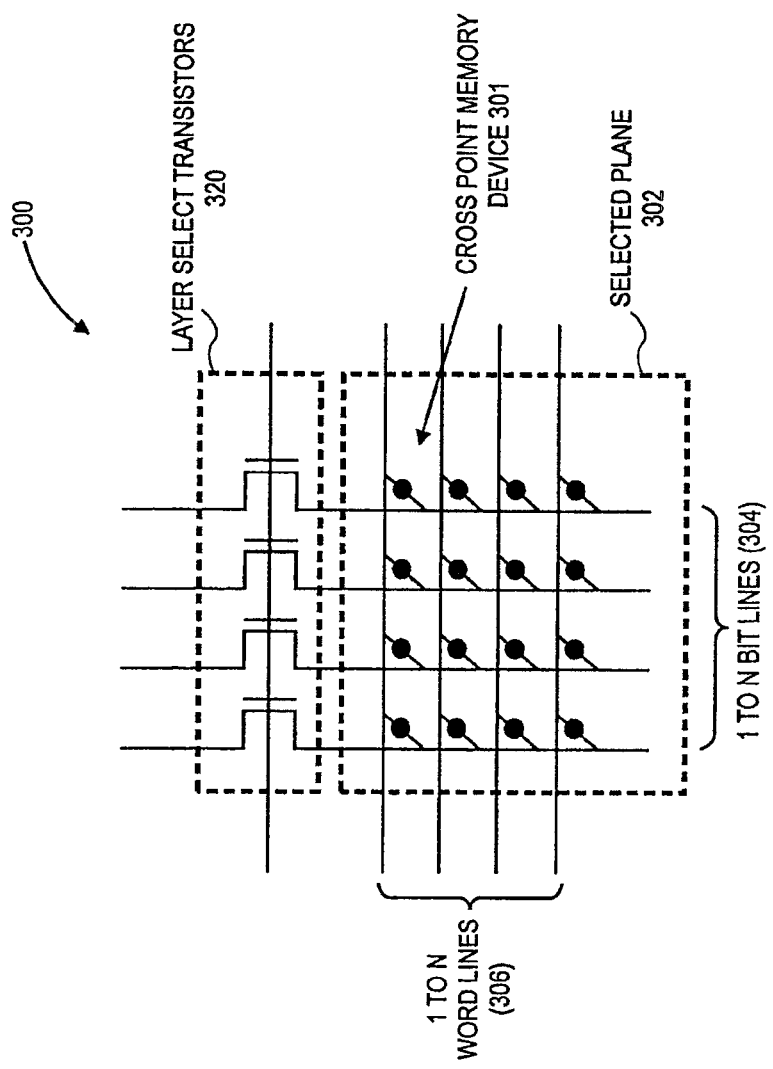
FIG. 3 illustrates an exemplary memory device having a selected horizontal plane with cross point memory devices.

FIG. 3 illustrates an exemplary memory device 300 having a selected horizontal plane 302 with cross point memory devices 301. Layer select transistors 320 are connected to an array of cross point memory devices 301, any of which can activate or choose the selected plane 302. These transistors 320 can be formed on the same plane as horizontal plane 302 or on a different one such as the ground level of the substrate. The array of cross point memory devices 301 is interconnected with 1 to N word lines (306) and bit lines (304). Examples of cross point memory devices may include multiple functional elements such as a rectifying element (e.g., a diode) and a memory state element (e.g., a fuse, anti-fuse, or a resistance variable device). These functional elements can be treated as separate and isolated devices and can be serially connected. Alternatively, these functional elements can be combined into a single device, such as, for example, a chalcogenide phase change resistor.

Figure 4:
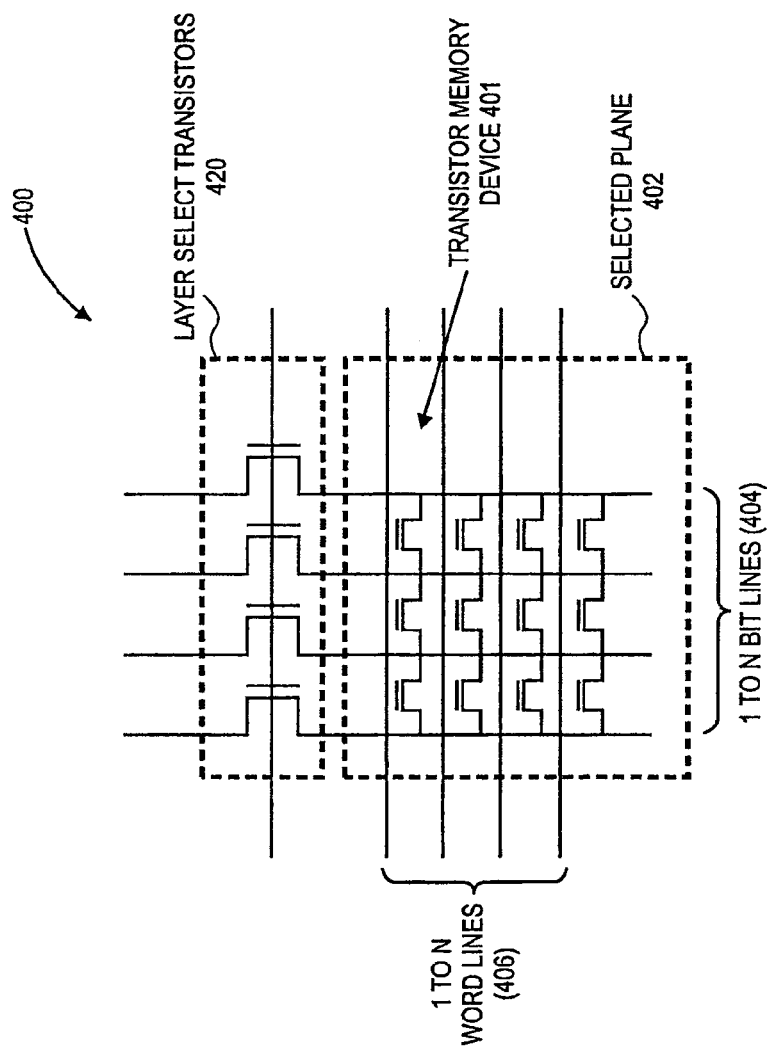
FIG. 4 illustrates an exemplary memory device having a selected horizontal plane with transistor memory devices.

FIG. 4 illustrates an exemplary memory device 400 having a selected horizontal plane 402 with transistor memory devices 401. Layer select transistors 420 are connected to an array of transistor memory devices 401, any of which can activate or choose the selected plane 402. These transistors 420 can be formed on the same plane as horizontal plane 402 or one a different one such as the ground level of the substrate. The array of transistor memory devices 401 is interconnected with 1 to N word lines (406) and bit lines (404). Examples of transistor memory devices include a floating gate transistor (e.g., a Si floating gate transistor), a dielectric trapped charge device (e.g., a nitride trapped transistor), or a nanocrystal device (e.g., a Si nanocrystal transistor).

Figure 5:
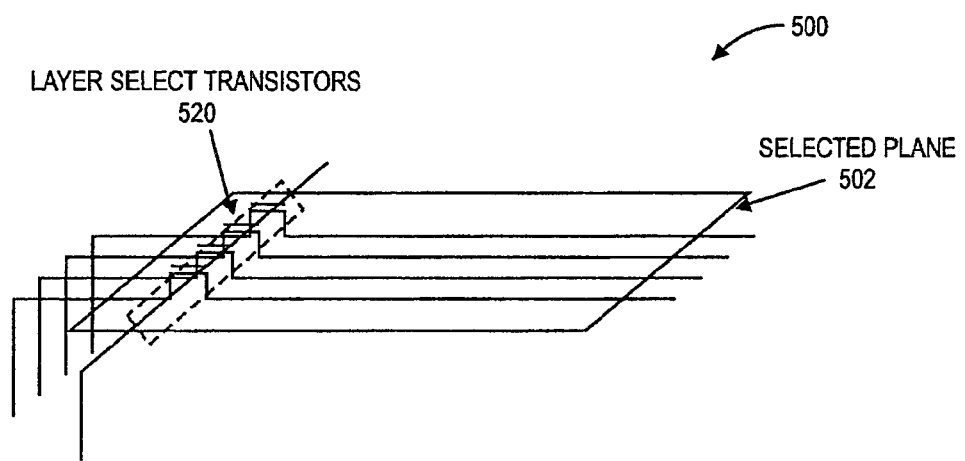
FIG. 5 illustrates an exemplary memory device having layer select transistors on the same plane as the selected plane.
Figure 6:
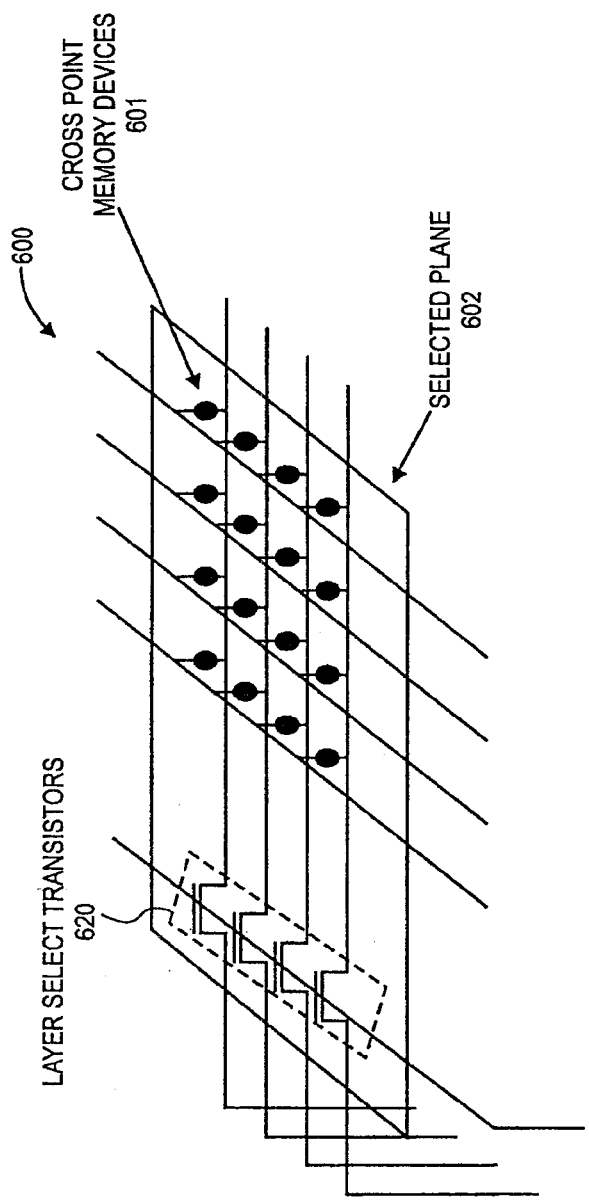
FIG. 6 illustrates an exemplary memory device having layer select transistors on the same plane as the selected plane with cross point memory devices.
Figure 7:
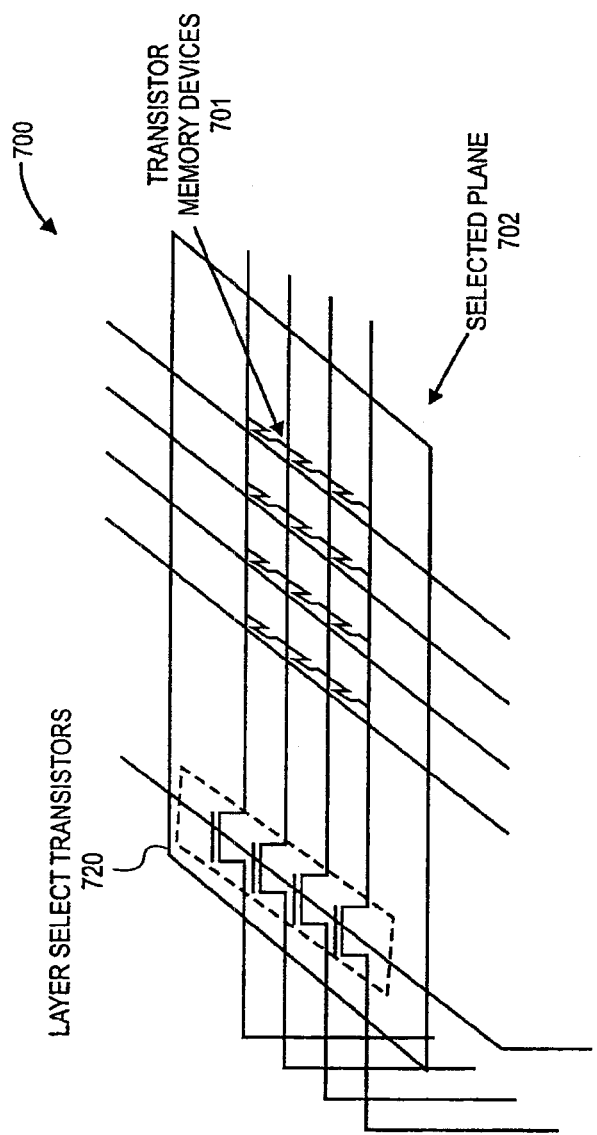
FIG. 7 illustrates an exemplary memory device having layer select transistors on the same plane as the selected plane with transistor memory devices.

FIG. 5 illustrates an exemplary memory device 500 having layer select transistors 520 on the same plane as the selected plane 502. In this example, one or more layer selecting transistors 520 select a memory array or memory cells in the horizontal plane 502 such that the selecting transistors 520 and the memory arrays or cells are part of the same selected plane 502. FIG. 6 illustrates an exemplary memory device 600 having layer select transistors 620 on the same plane as the selected plane 602 with cross point memory devices 601. These memory devices 601 can be the same as described in FIG. 3. The transistors 620 can be used for selecting, controlling, or addressing the cross point memory devices 601. FIG. 7 illustrates an exemplary memory device 700 having layer select transistors 720 on the same plane as the selected plane 702 with transistor memory devices 701. These memory devices 701 can be the same as described in FIG. 4. The transistors 720 can be used for selecting, controlling, or addressing the transistor memory devices 701. These transistors may be fabricated using conventional semiconductor film processes.

Figure 8:
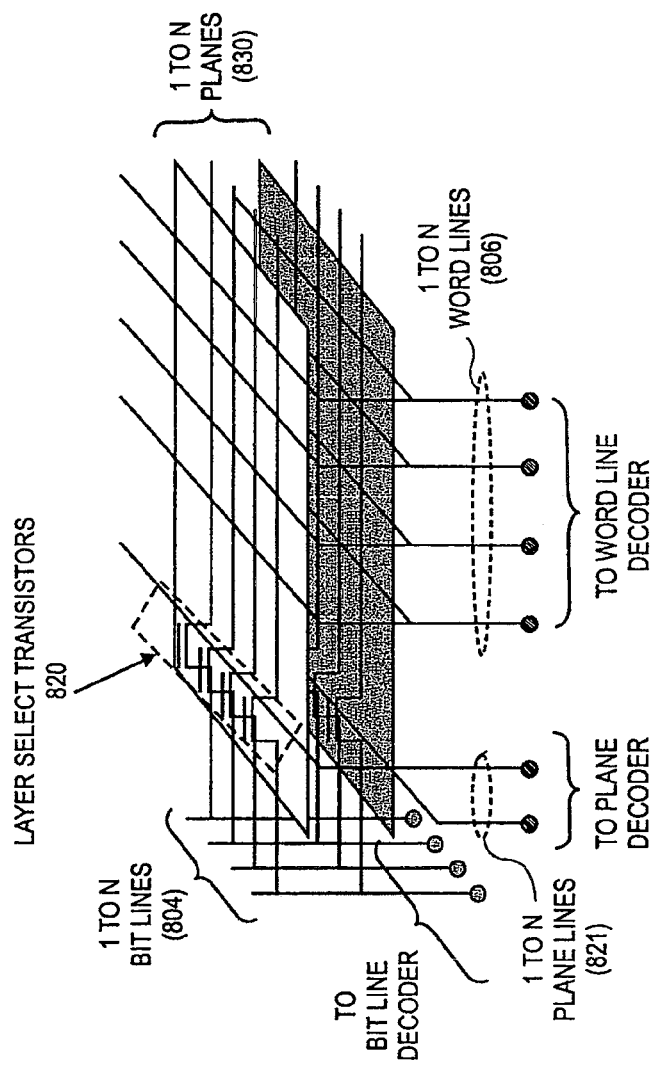
FIG. 8 illustrates an exemplary memory device having layer select transistors on each layer or plane along with interconnections to the plane, word line, and bit line decoders.

FIG. 8 illustrates an exemplary memory device 800 having layer select transistors 820 on each layer or plane along with interconnections to the plane, word line, and bit line decoders. The 1 to N bit lines (804) are connected to a bit line decoder and the 1 to N word lines (806) are connected to a word line decoder. The 1 to N planes lines are connected to a plane decoder. In this example, one of the plane lines 821 connects to layer select transistors 820 on one of the 1 to N layers or planes (830) having memory arrays. Through such interconnections and the plane, word line, and bit line decoders, various memory arrays or memory cells can be selected, controlled, or addressed on any of the 1 to N planes 830.

For example, in the case of reading data from the memory cells on the top plane of planes 830, a plane decoder outputs an appropriate control signal connected to the gates of the layer select transistors on the top one of the planes 830. This causes the select transistors 820 to turn on, which allows signals to pass through to the bit lines 804. The word line decoder connected to the 1 to N word lines (806) can output appropriate control signals to turn the respective memory cells on in that memory array. The bit line decoder connected the 1 to N bit lines 804 can then read stored data from the memory cells.

Figure 9:
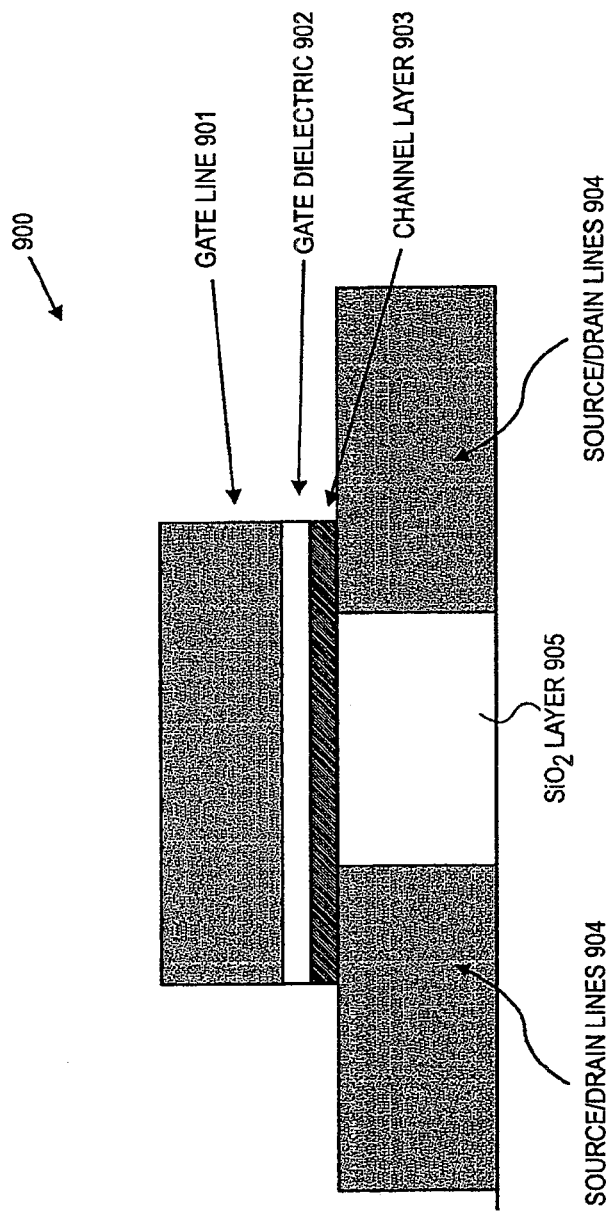
FIG. 9 illustrates one example of a layer select transistor.

FIG. 9 illustrates one example of a select transistor 900. Transistor 900 includes a channel layer 903 formed above source/drain lines 904 and SiO.sub.2 layer 905. A gate dielectric 902 is formed above the channel layer 903 and a gate line 901 is formed above the gate dielectric 902. Transistor 900 can be implemented in the examples of FIGS. 1-8, as the layer select transistor. The transistor 900 may include source and drain regions connected to sour/drain lines 904, which may include n-type polysilicon. The channel layer 903 may include a p-type silicon Si layer and formed adjacent to the source and drain regions. The gate dielectric layer 902 may include a silicon dioxide SiO.sub.2 layer or a stacked structure comprising SiO.sub.2, SiN, and SiO.sub.2 layers formed over the channel layer 903. The gate line 901 may include polysilicon formed over the gate dielectric layer 902. The gate lines 901 and source/drain lines 904 can be doped polysilicon lines and include a metal silicide layer to increase conductivity. These lines 901 and 904 can also include W, cobalt Co, Ti titanium, and Ni nickel. The gate lines 901 and source/drain lines 904 can include other suitable metals.

Figure 10:
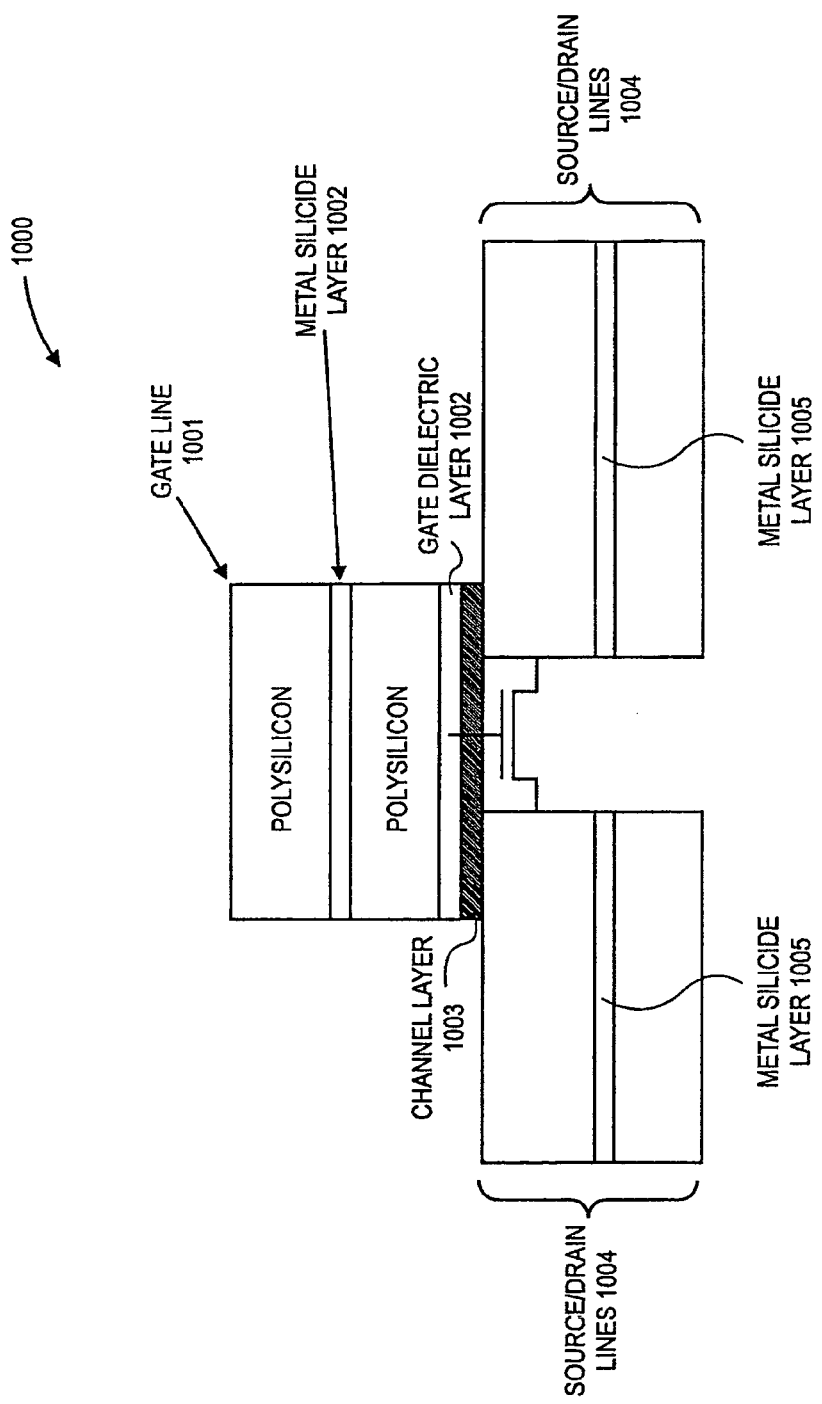
FIG. 10 illustrates another example of a layer select transistor with stacked structures.

FIG. 10 illustrates another example of a layer select transistor 1000 with stacked structures. In this example, the gate lines 1001 and source/drain lines 1004 are stacked structures including metal silicide layers 1002 and 1005, respectively, sandwiched in between polysilicon layers. The polysilicon layers can be replaced with other suitable semiconductor materials. The metal silicide layers 1002 and 1005 can be used to reduce the polysilicon resistance and improve stacking capability, examples of which include sandwiched silicide structures of polysilicon/TiN/TiSi.sub.2 (or Wsi/TiN/polysilicon may be used. In some examples, the layer-selecting transistors may be configured and formed in a way to approximate or duplicate the configuration of the memory cells of the corresponding memory array. By having a similar configuration, the layer-selecting transistors may be manufactured together with other memory cells without any or much changes in the manufacturing process.

Figures 11A, 11B:
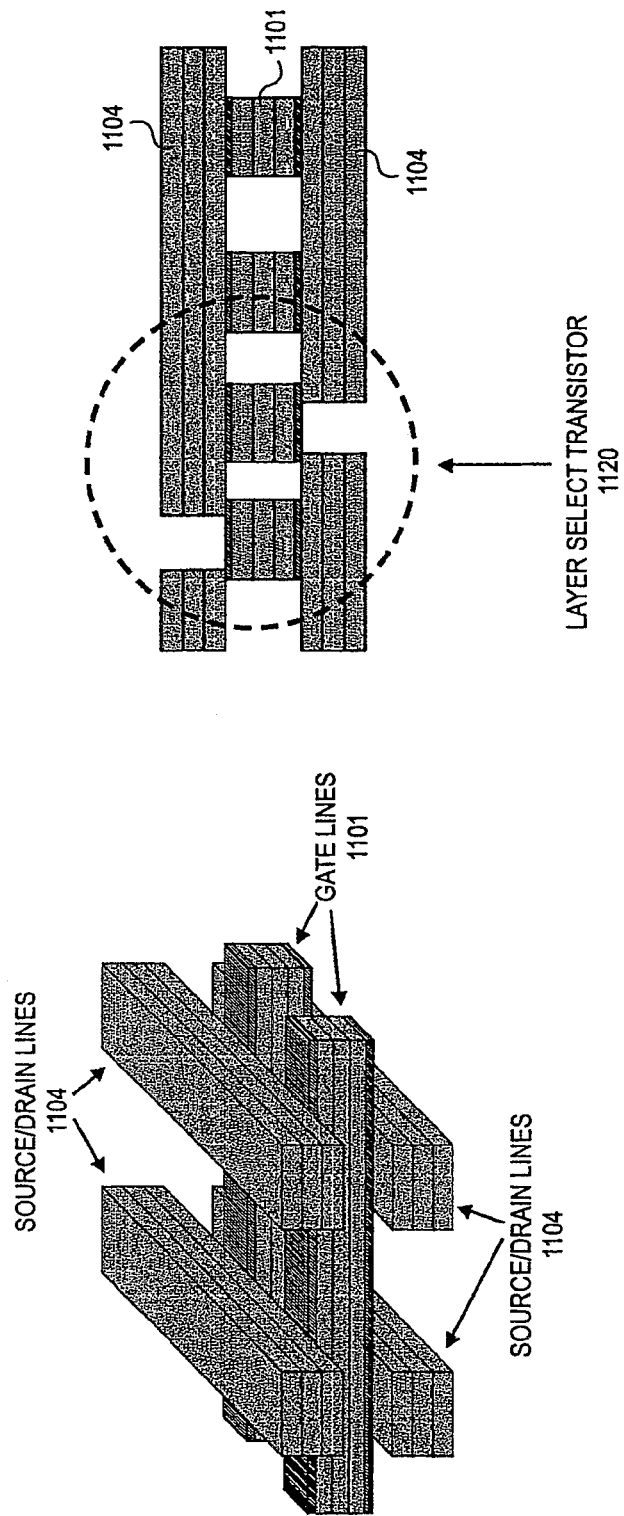
FIG. 11A illustrates one example of a three-dimensional schematic diagram of neighboring layer select transistors having source/drain lines and gate lines.
FIG. 11B illustrates one example of a cross-sectional view of the memory device of FIG. 11A.

FIG. 11A illustrates one example of a three-dimensional schematic diagram neighboring layer selecting transistors having source/drain lines 1104 and gate lines 1101. The transistors depicted in FIG. 11 can be inverted and stacked silicon-oxide-nitride-oxide-silicon (SONOS) type transistors as described in the related application "THREE-DIMENSIONAL MEMORY DEVICES." FIG. 11B is a cross-sectional view of the memory device of FIG. 11A showing layer select transistor 1120 with respect to gate lines 1101 and source/drain lines 1104. FIG. 12A illustrates another example of a three-dimensional schematic diagram of neighboring layer selecting transistors having source/drain lines 1204 and gate lines 1201. FIG. 12B illustrates one example of a cross-section view of the memory device of FIG. 12A. In this cross-section view, a layer select transistor 1220 and gate insulator 1225 are shown. The gate insulator 1225 can be formed from multiple layers. In one example, the gate insulator 1225 includes a stacked structure of multiple layers including SiO2/SiN/SiO.sub.2, used as a nitride trapped charge storage memory.

Referring to FIGS. 12A and 12B, a bit line (i.e., source/drain line 1204) corresponding to the layer select transistor 1220 may be provided with an opened gap. The two ends neighboring the gap can serve as the source and drain regions of the layer select transistor 1220. In one example, an ion implantation process or etching process on the gate line for the layer select transistors may applied to isolate the leakage path between bit lines. In this manner, fabricating the layer select transistor 1220 allows the transistor to be manufactured together with the corresponding bit line of the corresponding memory array without the need for major redesign of the transistor structure and the fabrication processes. Therefore, the manufacturing of the layer-selecting transistors may be incorporated into the manufacturing processes of the memory cells.

Figure 13A:
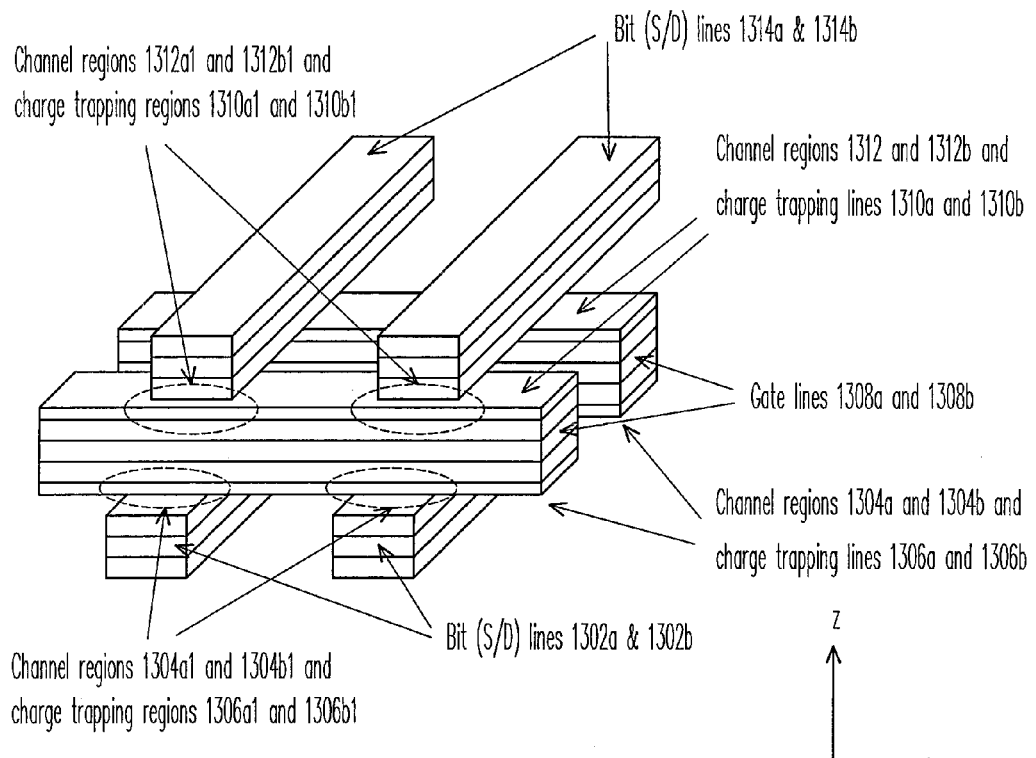
FIG. 13A illustrates a memory cell is provided at each intersection of one word line and one bit line.

FIG. 13A illustrates an exemplary structure of a three-dimensional memory device. Referring to FIG. 13A, the memory device may include a first pair of bit lines 1302a and 1302b; a first pair of word lines 1308a and 1308b that cross over the first pair of bit lines 1302a and 1302b; a first set of channel regions 1304a1 and 1304b1 each disposed near where one of the first pair of word lines 1308a and 1308b crosses over one of the first pair of bit lines 1302a and 1302b; a first set of charge trapping regions 1306a1 and 1306b1 each disposed between one of the first set of channel regions 1304a1 and 1304b1 and the corresponding word line of the first pair of word lines 1308a and 1308b.

The memory device may further include a second pair of bit lines 1314a and 1314b that cross over the first pair of word lines 1308a and 1308b; a second set of channel regions 1312a1 and 1312b1 each disposed near where one of the second pair of bit lines 114a and 114b crosses over one of the first pair of word lines 1308a and 1308b; a second set of charge trapping regions 1310a1 and 1310b1 each disposed between one of the second set of channel regions 1312a1 and 1312b1 and the corresponding word line of the first pair of word lines 1308a and 1308b.

In one example, the first set of channel regions 1304a1 and 1304b1 may be provided by a first pair of channel lines 1304a and 1304b that are formed above below the first pair of word lines 1308a and 1308b; and the second set of channel regions 1312a1 and 1312b1 may be provided by a second pair of channel lines 1312a and 1312b that are formed over the first pair of word lines 1308a and 1308b. Also, the first set of charge trapping regions 1306a1 and 1306b1 may be provided by a first pair of charge trapping lines 1306a and 1306b that are formed between the first pair of channel lines 1304a and 1304b and the first pair of word lines 1308a and 1308b. And the second set of charge trapping regions 1310a1 and 1310b1 may be provided by a second set of charge trapping lines 1310a and 1310b that are formed between the first pair of word lines 1308a and 1308b and the second pair of channel lines 1312a and 1312b.

In one example, the first pair of channel lines 1304a and 1304b, a first pair of charge trapping lines 1306a and 1306b; and the first pair of word lines 1308a and 1308b may be generally aligned or have similar line-style patterns. Similarly, the second pair of channel lines 1312a and 1312b, the second pair of charge trapping lines 1310a and 1310b; and the first pair of word lines 1308a and 1308b may be generally aligned or have similar line-style patterns. Therefore, referring to FIG. 13A, these structures may be stacked to form two line-style structures, which may be configured to cross with the first pair of bit lines 1302a and 1302b and the second pair of bit lines 1314a and 1314b, such as at an approximately perpendicular direction shown in the figure.

In some examples, the first pair of bit lines 1302a and 1302b and the second pair of bit lines 1314a and 1314b each may be formed by a conductive material, such as n-type polysilicon, for providing source or drain regions of TFT memory cells. In addition, metal silicide such as $TiSi_2$ and WSi may also be included to form a sandwiched structure having at least one metal silicide layer between two polysilicon layers, as shown in FIG. 13A. As noted above, TiN may be provided as a barrier layer between metal silicide and polysilicon materials. In some examples, the first pair of channels lines 1304a and 1304b and the second pair of channel lines 1312a and 1312b each may include p-type silicon, such as p-type silicon. And the first pair of word lines 1308a and 1308b each may include at least one of polysilicon, metal silicide, and TiN or the sandwiched structure having polysilicon, metal silicide, and TiN as noted above. In some examples, to provide the first set of charge trapping regions 1306a1 and 1306a2 and the second set of charge trapping regions 1310a1 and 1310b1, a tri-layer structure having two silicon oxide layers with a silicon nitride layer in between may be used.

Although the schematic diagram shows only two pairs and bit lines and one pair of word lines, the structure can be further horizontally expanded or vertically stacked with more word lines, bit lines, and corresponding channel regions and charge trapping regions for providing more memory cells. In other words, the number of word lines, bit lines, channel lines, and charge trapping lines may be vertically and/or horizontally expanded to provide a large memory matrix having numerous memory cells.

Figure 13B:
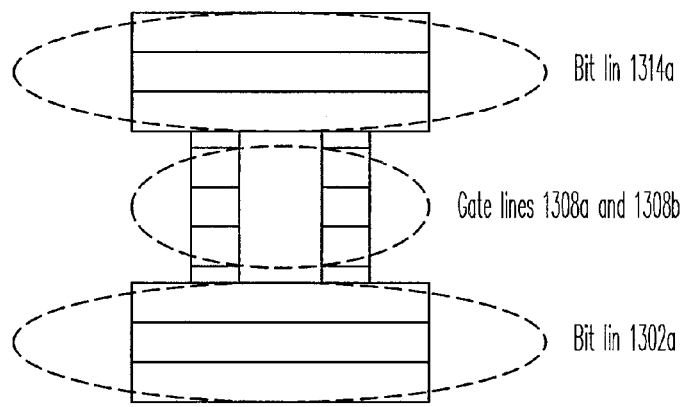
FIG. 13B illustrates a schematic cross-sectional view from the y direction of FIG. 13A to illustrate the structure of four memory cells.
Figure 13C:
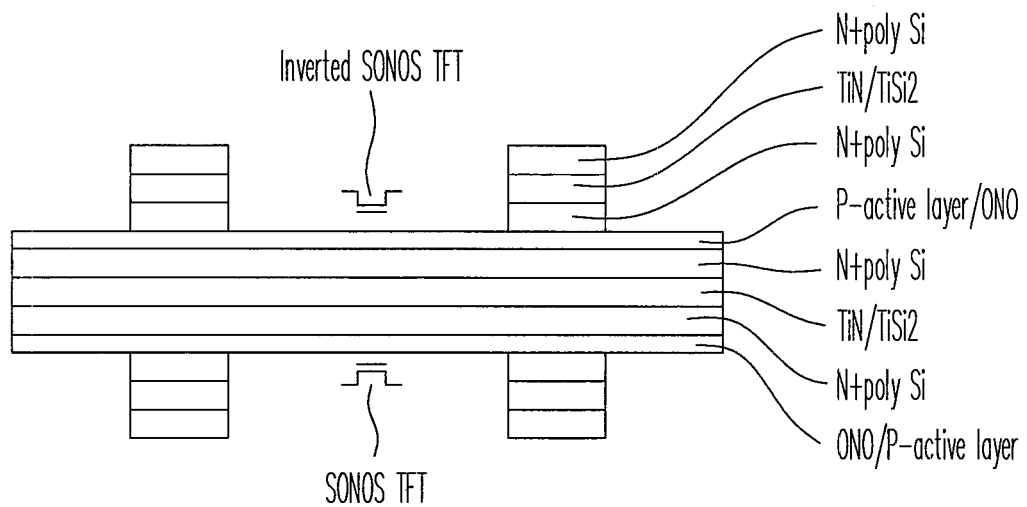
FIG. 13C illustrates another schematic cross-sectional view of the memory device in FIG. 13A from the x direction and equivalent circuitry symbols.
Figure 13D:
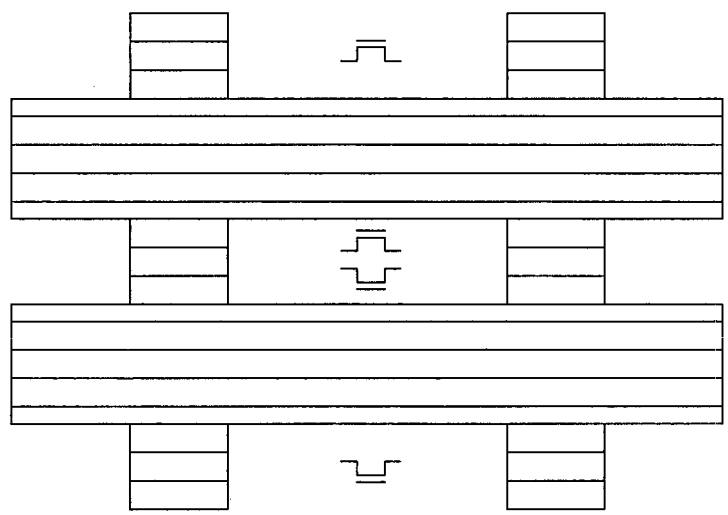
FIG. 13D illustrates a schematic diagram showing four memory cells provided by a stacked structure of five layers.

As shown in FIG. 13A, a memory cell is provided at each intersection of one word line and one bit line. FIG. 13B illustrates a schematic cross-sectional view from the y direction of FIG. 13A to illustrate the structure of four memory cells. The two cells formed by bit line 1302a and gate lines 1308a and 1308b have their gates above the source and drain regions provided by bit line 102a. And the two cells formed by bit line 1314a and gate lines 1308a and 1308b have their gates below the source and drain regions provided by bit line 1314a, thereby becoming two "inverted" cells. FIG. 13C illustrates another schematic cross-sectional view of the memory device in FIG. 13A from the x direction and equivalent circuitry symbols. As shown in FIG. 13C, two SONOS TFT memory cells are provided by the structure shown in the figure. FIG. 13D illustrates a schematic diagram showing four memory cells provided by a stacked structure of five layers (three bit lines and two gate lines and corresponding channel and charge trapping regions).

Figure 14A:
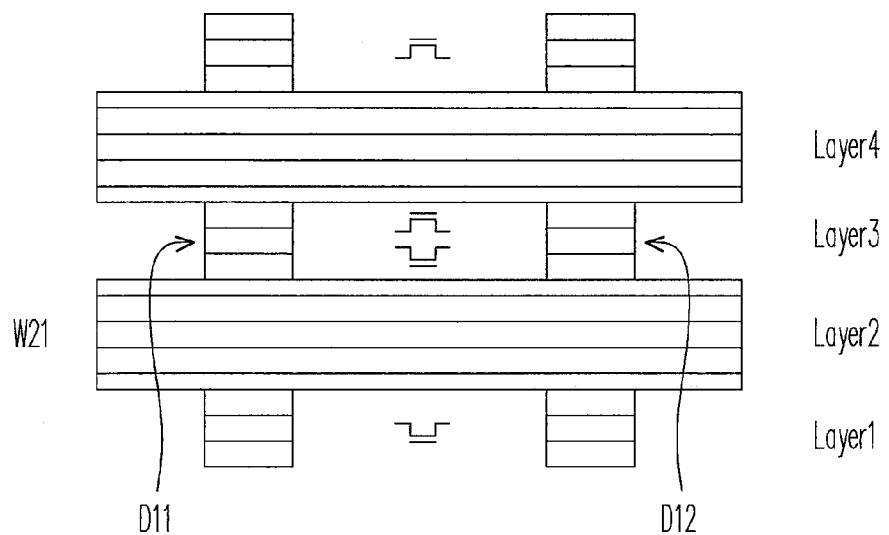
FIGS. 14A and 14B further illustrate the memory array formed by Layer 1 and Layer 2.
Figure 14B:
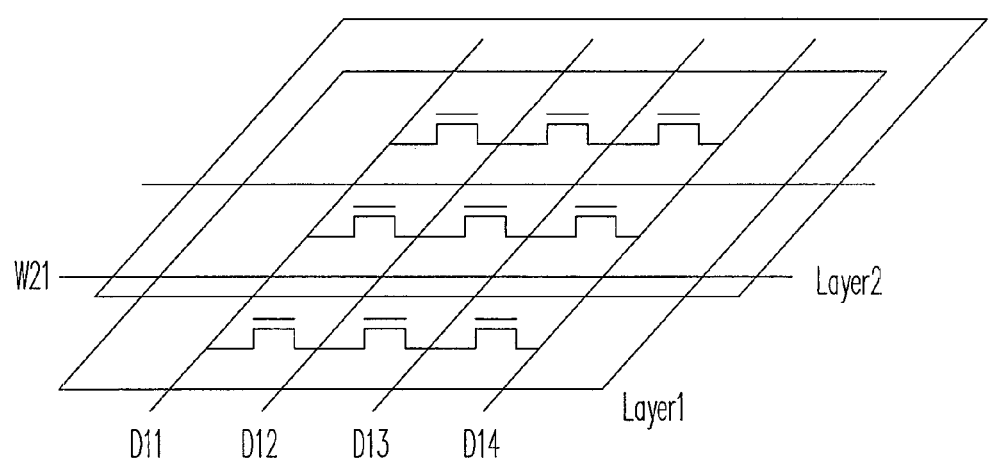
Figure 14C:
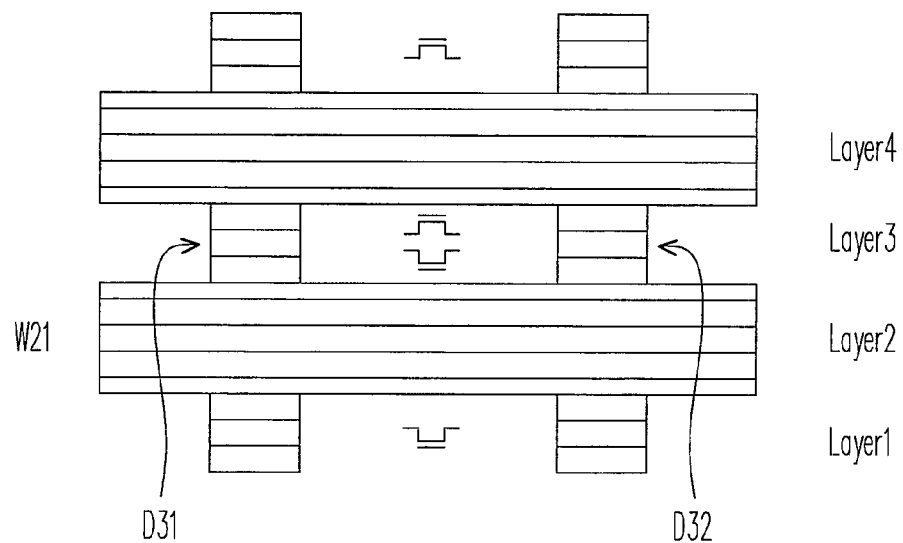
FIGS. 14C and 14D illustrate another memory array formed by Layer 2 and Layer 3.
Figure 14D:
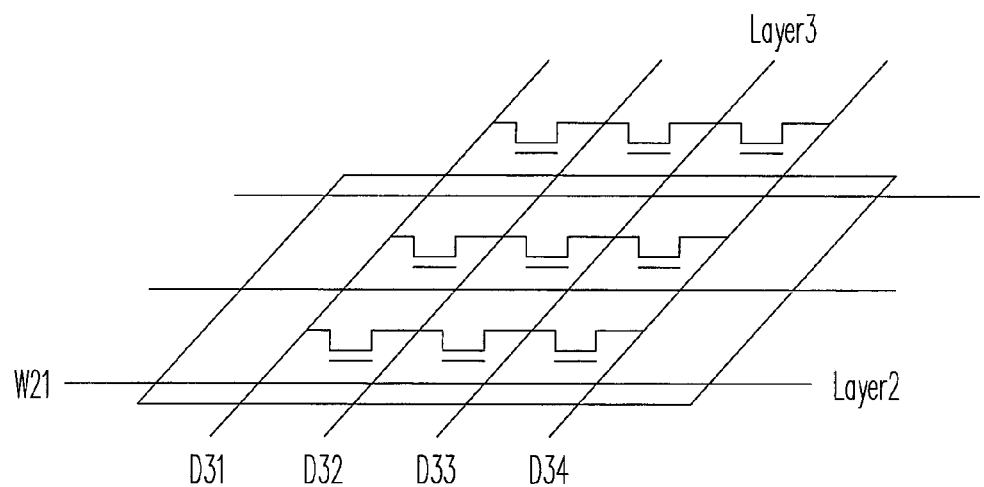

Taking the five-stacked-layer structure as an example, FIGS. 14A and 14B further illustrate the memory array formed by Layer 1 and Layer 2. In one example, Layer 1 provides source and drain lines as bit lines of the memory array, and Layer 2 provides gate lines as word lines of the memory array. FIGS. 14C and 14D illustrate another memory array formed by Layer 2 and Layer 3. In particular, Layer 3 provides source and drain lines as bit lines of the memory array, and Layer 2 provides gate lines as word lines of the memory array. The transistors or memory cells provided by Layer 2 and Layer 3 are upside-down compared to those formed by Layer 1 and Layer 2.

As discussed above, the examples consistent with of the invention may provide a three-dimensional memory device. In addition, the examples above may provide a layer decoding scheme for the three-dimensional memory that may allow simplified decoding circuit design. As noted above, the layer-selecting transistors may be placed on the ground layer. Alternatively, the layer-selecting transistors may be placed on the corresponding layer or plane of the memory array that the layer-selecting transistors are designed to address to.

The examples of the layer decoding scheme noted above may be suitable to cross-point memories as well as transistor memories. In some examples, cross-point memory may be fuse memory, antifuse memory, phase-change memory, resistor-changeable memory, or capacitor-changeable memory. In some examples, transistor memory may be floating gate memory, charge-trapping memory, or nanocrystal memory. Additionally, the memory cells in some examples may be nonvolatile or volatile. For the layer-selecting transistors, they can be made of thin-film transistors using single crystal, poly-crystal, amorphous, or polymer semiconductor.

In one example, the use of a layer decoding scheme may reduce design complexity. Furthermore, products with a three-dimensional matrix design may easily vary the density of memory cells by varying the layer number without changing the circuits. And the layer decoding scheme using layer-selecting transistors placed on the corresponding layers may reduce the chip area needed for the entire memory device.

The foregoing disclosure of various examples consistent with the present invention has been presented for purposes of illustration and description. It is not intended to be exhaustive or to limit the invention to the precise forms disclosed. Many variations and modifications can be made to the examples described herein without departing from the scope of the intention. The scope of the invention is to be defined only by the claims appended hereto, and by their equivalents.

Further, in describing those examples, the specification may have presented the method and/or process in a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A semiconductor cell comprising:
   a gate;
   a dielectric layer adjacent to the gate; and
   a channel layer adjacent to the dielectric layer and formed above a source region, a drain region, and an oxide region,
   wherein each of the gate, the source region and the drain region includes a stacked structure, and the stacked structure is a sandwiched structure including a first polysilicon layer, a second polysilicon layer and a metal silicide layer between the first polysilicon layer and the second polysilicon layer.

2. The semiconductor cell of claim 1, wherein the oxide region is a silicon dioxide region.

3. The semiconductor cell of claim 1, wherein the oxide region is located between the source region and the drain region.

4. The semiconductor cell of claim 1, wherein the channel layer is located between the dielectric layer and the oxide region.

5. The semiconductor cell of claim 1, wherein the dielectric layer is located between the gate and the channel layer.

6. The semiconductor cell of claim 1, wherein the channel layer bridges the source region and the drain region.

7. The semiconductor cell of claim 1, wherein the channel layer includes a p-type silicon Si layer.

8. The semiconductor cell of claim 1, wherein the metal silicide layer includes a sandwiched silicide structure of polysilicon/TiN/TiSi$_2$ or WSi/TiN/polysilicon.

9. The semiconductor cell of claim 1, wherein each of the gate, the source region and the drain region includes doped polysilicon, metal silicide, tungsten, cobalt, titanium or nickel.

10. A semiconductor cell comprising:
    a gate;
    a dielectric layer adjacent to the gate; and
    a channel layer adjacent to the dielectric layer and formed above an oxide and on a portion of a source region and a portion of a drain region, wherein the channel layer bridges the source region and the drain region,
    wherein each of the gate, the source region and the drain region includes a stacked structure, and the stacked structure is a sandwiched structure including a first polysilicon layer, a second polysilicon layer and a metal silicide layer between the first polysilicon layer and the second polysilicon layer.

* * * * *